United States Patent [19]
Kwong et al.

[11] Patent Number: 5,963,047
[45] Date of Patent: Oct. 5, 1999

[54] NOISE SUPRESSION USING NEIGHBOR-SENSING FOR A CMOS OUTPUT BUFFER WITH A LARGE DC CURRENT SINK

[75] Inventors: David Kwong, Fremont; Huijun Jeffrey Cui, Mountain View, both of Calif.

[73] Assignee: Pericom Semiconductor Corp., San Jose, Calif.

[21] Appl. No.: 08/917,148

[22] Filed: Aug. 25, 1997

Related U.S. Application Data

[63] Continuation-in-part of application No. 08/685,142, Jul. 23, 1996, Pat. No. 5,717,343.

[51] Int. Cl.$^6$ ............................................. H03K 19/0185
[52] U.S. Cl. ............................... 326/27; 326/83; 326/87
[58] Field of Search .................................. 326/83, 86–87, 326/121, 30, 26–27

[56] References Cited

U.S. PATENT DOCUMENTS

| | | | |
|---|---|---|---|
| 5,212,801 | 5/1993 | Farmer | 326/27 |
| 5,241,221 | 8/1993 | Fletcher et al. | 326/170 |
| 5,268,868 | 12/1993 | Kajigaya et al. | 365/206 |
| 5,296,758 | 3/1994 | Sandhu . | |
| 5,319,252 | 6/1994 | Pierce et al. . | |
| 5,319,260 | 6/1994 | Wanlass . | |
| 5,341,040 | 8/1994 | Garverick et al. . | |
| 5,347,177 | 9/1994 | Lipp . | |
| 5,410,262 | 4/1995 | Kang | 327/170 |
| 5,424,653 | 6/1995 | Folmsbee et al. | 326/26 |
| 5,438,277 | 8/1995 | Sharpe-Geisler | 326/27 |
| 5,528,166 | 6/1996 | Iikbahar | 326/27 |
| 5,559,447 | 9/1996 | Rees | 326/86 |
| 5,717,343 | 2/1998 | Kwong | 326/83 |

*Primary Examiner*—Jon Santamauro
*Attorney, Agent, or Firm*—Stuart T. Auvinen

[57] ABSTRACT

A CMOS output buffer has as pull-downs a smaller driver transistor and a larger driver transistor. Both transistors drive the output low in parallel initially during a voltage transition, but the larger transistor is disabled for the remainder of the output voltage swing when reflections and ringing occur. A pulse is generated by a transition detector when an input to the output buffer transitions low. The pulse generated disables the larger driver for a short period of time but later re-enables the driver. Thus the large driver remains on after the switching is complete, providing large IOH and IOL static currents. The pulse is long enough to keep the large driver disabled while reflections are received and ringing occurs after the voltage transition. A Resistor in series with the smaller driver transistor absorbs these reflections. The output impedance is pulsed to the higher impedance of the first stage when ringing occurs at the end of the voltage transition, but after the pulse ends, the lower impedance of the large driver is seen. Pulses are generated when any neighboring output changes. The pulse generated is sent to all neighboring output buffers to disable their large drivers when noise in injected into the power or ground supplies.

19 Claims, 6 Drawing Sheets

NOISE SUPRESSION USING NEIGHBOR-SENSING FOR A CMOS OUTPUT BUFFER WITH A LARGE DC CURRENT SINK

RELATED APPLICATION

This application is a continuation-in-part of the co-pending application for "A High-Drive CMOS Output Buffer with Noise Suppression Using Pulsed Drivers and Neighbor-Sensing", U.S. Ser. No. 08/685,142, filed Jul. 23, 1996, now U.S. Pat. No. 5,717,343.

BACKGROUND OF THE INVENTION

1. Field of the Invention

This invention relates to CMOS output buffers, and more particularly to low-noise and impedance-adjusting output buffers.

2. Description of the Related Art

Complementary metal-oxide-semiconductor (CMOS) circuits are often used as interface or "glue" logic for digital systems. Higher-performance systems require increased speed and current requirements for the glue logic. Higher current drive increases speed because load capacitances are more quickly charged or discharged. Unfortunately, unwanted noise often increases too.

CMOS chips with higher-drive output buffers often produce a type of noise known as ground bounce, due to rapid changes in current through the parasitic inductances of the integrated circuit (IC) package. These inductances resist changes in current by changing the voltages on power or ground supplies. Such voltage changes can falsely trigger logic within the IC device, or other devices in the system.

The rate of voltage change of the output, the edge rate, increases for these faster devices. The high edge rate can reflect off the ends of printed-circuit-board (PCB) wiring traces driven by the output buffer. These reflections produce voltage variations known as undershoot, overshoot, and ringing (oscillation). Careful layout of these wiring traces is needed to minimize trace-ends that can cause reflections. Termination devices such as resistors to ground at the ends of the traces are often used to absorb the reflection-causing wave front produced by the high edge rate.

Dampening resistors are sometimes used. Dampening resistors are resistors in series on the wiring trace rather than to power or ground. Dampening resistors reduce or slow down the high edge rate as well as any reflections. While discrete dampening resistors are often used, the output buffer itself provides some impedance, which also acts as a dampening resistor. Unfortunately, this impedance decreases with higher-current-drive output buffers. The lower impedance of these output buffers creates a greater mismatch between the output buffer's impedance and the impedance of the wiring trace.

Power budgets also limit the quality of termination. Lower-impedance resistors consume much power. CMOS chips driving terminated lines can only sink or source a limited amount of current in the static or D.C. state. The D.C. current specifications of CMOS chips, known as $I_{OL}$ and $I_{OH}$, are usually not large enough for termination resistors smaller than 100 or 50 ohms. Better termination could be obtained if 10 or 20-ohm resistors were used for termination.

Figure 1:
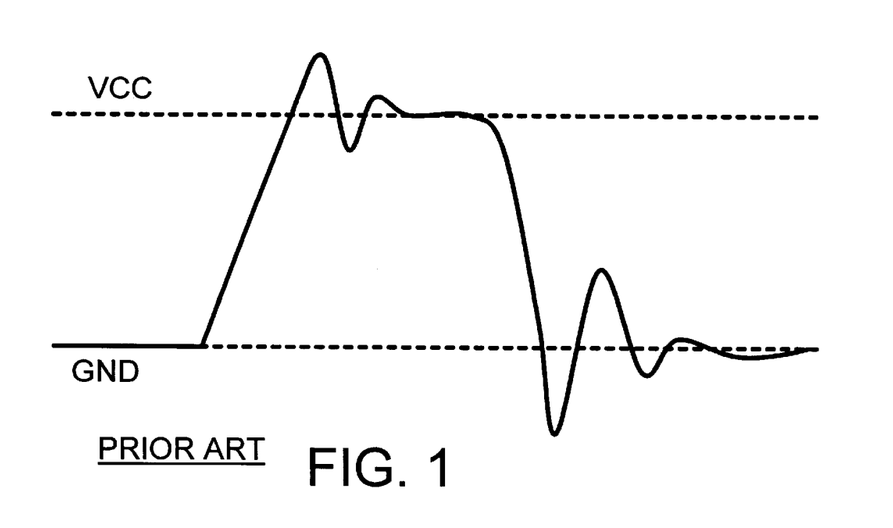
FIG. 1 is a diagram of a waveform of a prior-art high-drive output buffer driving a PCB wiring trace.

FIG. 1 is a diagram of a waveform of a prior-art high-drive output buffer driving a PCB wiring trace. The high current drive of the output buffer produces a high edge rate that rapidly changes the output voltage from ground to the power-supply voltage, Vcc. The high edge rate produces a wave front that travels down the wiring trace and reflects off one or more ends. The reflected wave front then travels back up the wiring trace to the output buffer, and raises the voltage at the output buffer when the reflected wave arrives. The raised voltage is above Vcc and is known as an overshoot. This reflected wave then reverses direction and travels back to the end of the wiring trace, is reflected, and again reaches the output buffer, producing a series of both overshoots and undershoots, known as ringing. Since the reflected wave is dampened and loses energy at each reflection, the amplitude of the ringing gradually decreases. Low-going ringing (undershoot) is caused by a mis-match in impedance. Multiple reflections interfere with each other and cause the ringing.

When the output buffer switches from high to low, another high-edge rate wave travels down the wiring trace and is reflected back, producing undershoot and more ringing. This undershoot can cause ground bounce inside the output buffer's IC.

When the ringing and over/undershoot is large, logic can read a static signal as low when the static signal is actually high. For example, a static 3-volt signal input to another pin of the IC is a high signal, but when the internal ground of the IC bounces up from 0 volt to 2 volt, the static 3-volt signal appears to be a 1-volt signal, a low input. When the input signal is connected to a latch or flip-flop, the false low can be latched in, causing an error. Thus noise is a serious problem.

Several prior-art solutions to these problems are known. For example, Pierce et al., U.S. Pat. No. 5,319,252, assigned to Xilinx Inc. of San Jose, Calif., discloses an output buffer which gradually turns output buffers on and off so that there is no sharp discontinuity in the current flow. The output voltage is fed back to gradually turn off the output buffer at the end of the voltage transition. Lipp in U.S. Pat. No. 5,347,177, discloses a closed-loop trace which is driven by output buffers with level-sensitive impedance control.

Prior Art Pulses Large Drivers On

Sharpe-Geisler, U.S. Pat. No. 5,438,277, assigned to Advanced Micro Devices of Sunnyvale, Calif., discloses an output buffer using two pull-down devices. A noisy (larger) pull-down device is connected to a noisy ground (having ground bounce) while a quiet (smaller) pull-down device is connected to a quiet ground. A one-shot triggered by an internal signal first switches on the noisy pull-down, then turns off the noisy pull-down and turns on the quiet pull-down. Kang, U.S. Pat. No. 5,410,262, assigned to Samsung, is a similar approach.

Figure 2:
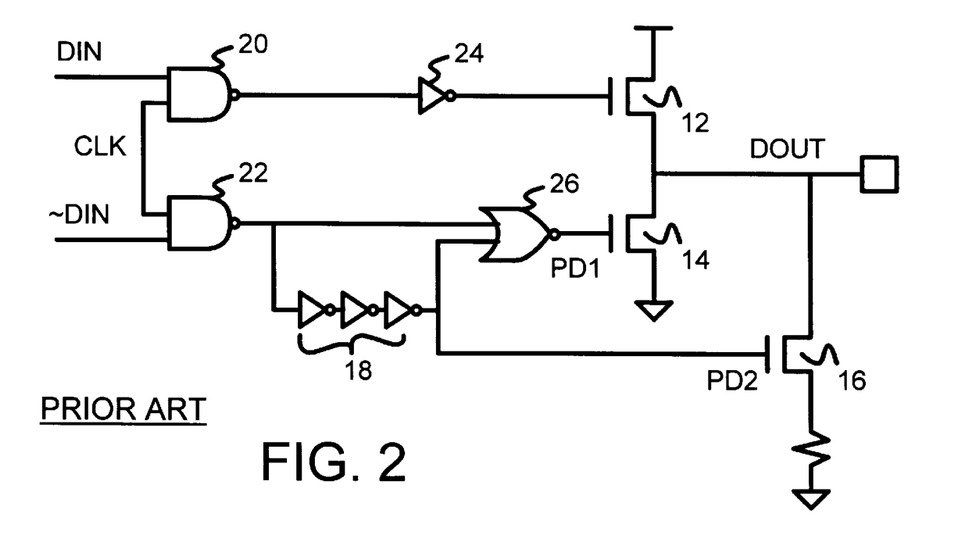
FIG. 2 is a prior-art output buffer that pulses a larger driver on during an output transition.

FIG. 2 is a prior-art output buffer that pulses a larger driver on during an output transition. When a clock CLK is active, NAND gates 20, 22 pass through an input DIN and its complement ~DIN. When DIN is high, inverter 24 drives the gate of pull-up transistor 12 high, which pulls output DOUT high. Nodes PD1 driving the gate of large pull-down transistor 14, and node PD2 driving the gate of small pull-down transistor 16, are both low.

When DIN switches low, NAND gate 22 outputs a low which is immediately propagated to the upper input NOR gate 26. Node PD2, the lower input of NOR gate 26, is still low, because the change in ~DIN has not yet propagated through inverting delay chain 18. Since both inputs to NOR gate 26 are temporarily low, node PD1 is high, turning on large pull-down transistor 14. However, the low on node PD2 keeps smaller pull-down transistor 16 off. After the change in ~DIN propagates through inverting delay chain 18, node PD2 becomes high, turning on smaller pull-down transistor 16, while turning off larger pull-down transistor 14 by the high input on NOR gate 26.

Figure 3:
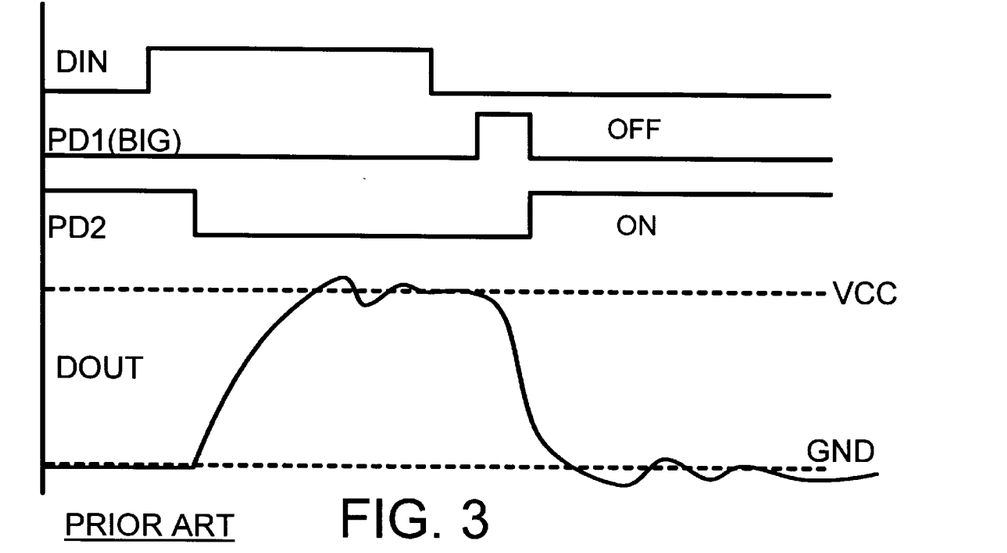

FIG. 3 is a timing diagram for the prior-art buffer of FIG. 2 showing that the larger pull-down transistor is pulsed on. When DIN goes low, node PD1 is pulsed on for a short time. The larger pull-down transistor rapidly changes the output voltage DOUT. However, the pulse on node PD1 ends before the voltage swing is complete to reduce ringing. Then the smaller pull-down transistor, driven by node PD2, completes the output voltage swing. The width of the pulse for PD1 is usually targeted for worst-case conditions of ground bounce, which is high Vcc and cold temperature.

While pulsing the larger pull-down transistor on and off during the output voltage transition is useful in reducing undershoot ground bounce, the D.C. current is limited to the current from the smaller pull-down transistor, since the larger transistor is only on during the output transition, not in static conditions. The lower D.C. current limits the impedance of the termination resistors, degrading termination.

When a CMOS chip has several outputs, sometimes one output's slewing can disrupt other outputs that are not changing. Especially when several outputs change at the same time is the problem of undershoot most severe.

What is desired is an output buffer with high current drive and high speed. It is desired to reduce noise from the fast edge rate, such as ringing, undershoot, overshoot, and ground bounce. It is desired to dynamically control the impedance of the output buffer to provide low impedance as the output voltage is rapidly changing, but high impedance when the reflected wave front is received to dampen the reflections. It is also desired to leave the larger drivers on during static periods to provide strong IOH and IOL output currents but have these drivers turn off during the critical ringing period. It is further desired to disable neighboring pins' output buffers when one output buffer switches to prevent noise coupling into other pin's outputs.

SUMMARY OF THE INVENTION

An impedance-switching output buffer has an input. A low-impedance stage drives current to an output. A higher-impedance stage also drives current to the output. A pulse generator is coupled to the input. It generates a pulse when the input switches to indicate that the output is to switch from a high voltage to a ground voltage.

A disable means receives the pulse from the pulse generator. It disables the low-impedance stage in response to the beginning of the pulse and re-enables the low-impedance stage in response to the end of the pulse. Both the low-impedance stage and the higher-impedance stage are enabled to drive current to the output after the end of the pulse. Thus static current is provided by both the low-impedance stage and the higher-impedance stage.

In further aspects of the invention the low-impedance stage has a pull-down MOS transistor connected to conduct current between a ground supply and the output. The higher-impedance stage has a resistor connected between the output and a first node. A pull-up MOS transistor is connected to conduct current between a power supply and the output. A pull-down MOS transistor is connected to conduct current between the ground supply and the first node. Thus the resistor increases impedance of the output buffer and absorbs reflections when the low-impedance stage is disabled by the pulse.

In further aspects the disable means has a logic gate means that receives the pulse. It drives a low voltage as a disabling voltage onto a control gate of the pull-down MOS transistor in the low-impedance stage in response to the pulse. The disabling voltage prevents current from flowing through the low-impedance stage to the output. Thus the low-impedance stage is disabled by the pulse.

In still further aspects, neighbor logic means in the pulse generator receives neighbor inputs from neighboring output buffers. The neighbor logic means generates the pulse when one of the neighbor inputs switches, indicating that a neighboring output switch to the ground voltage.

Neighbor isolation means is coupled to receive the pulse from the pulse generator. It drives the disabling voltage onto control gates of low-impedance stages in the neighboring output buffers. The disabling voltage prevents current from flowing through the low-impedance stages to the output. Thus the low-impedance stage is disabled by the neighbor inputs when a neighboring output buffer switches.

In further aspects the end of the pulse occurs less than 10 nano-seconds after the beginning of the pulse. Thus the pulse is sufficiently long to disable the low-impedance stage during ringing after the output reaches the power-supply voltage or the ground voltage.

BRIEF DESCRIPTION OF THE DRAWINGS

FIG. 3 is a timing diagram for the prior-art buffer of FIG. 2 showing that the larger pull-down transistor is pulsed on.

DETAILED DESCRIPTION

The present invention relates to an improvement in CMOS output buffers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Large Driver Transistors On for Static IOH, IOL

The inventor has realized that the impedance of a complementary metal-oxide-semiconductor (CMOS) output buffer can be dynamically adjusted. The large, high-drive transistors only need to be disabled during the end of the voltage transition and while reflected waves are returning to the output buffer. Once ringing has diminished, the large transistors can be re-enabled.

Leaving these large transistors on provides high static output current, such as IOL and IOH. Large IOH and IOL (high D.C. current) allow a low-impedance termination resistor to be used at the far end of the transmission line. The low-impedance termination helps to reduce reflected wavefronts and thus reduces ringing.

In the prior art, a one-shot enables these large transistors for just a short period of time at the beginning of the voltage transition, but disables the large transistors during all other times, including when no transitions occur. Thus the static currents, IOH and IOL, are limited by the quiet, smaller transistors since the larger transistors are disabled at all times except during the voltage swing.

Parent Application Uses Feedback to Pulse Larger Drivers Off

The parent application, now U.S. Pat. No. 5,717,343, disclosed an output buffer that used feedback from the output pad to generate a pulse. This pulse then disables the larger output-driver transistor. Thus the larger transistor is pulsed off rather than pulsed on. The larger transistors are left on during non-switching periods to supply a large IOH and IOL.

The output pad's voltage is sensed, and when a voltage threshold of about Vcc/2 is reached, the pulse is generated. This pulse is then used to disable the larger driver transistor until reflections and ringing have stopped.

The inventor has realized that feedback is not necessary for generating the pulse to disable the larger driver transistor. Instead, the disabling pulse can be generated internally. Not using feedback has the disadvantage of not being responsive to the actual output voltage and thus the actual loading and characteristics of the line. However, internally generating the disabling pulse is less complex to implement and less sensitive to noise on the output.

The parent application also disclosed neighbor sensing. When any of the neighboring outputs changed, all outputs are pulsed off. Even static outputs that are not changing are pulsed off. Disabling adjoining outputs during switching improves noise immunity.

Figure 4:
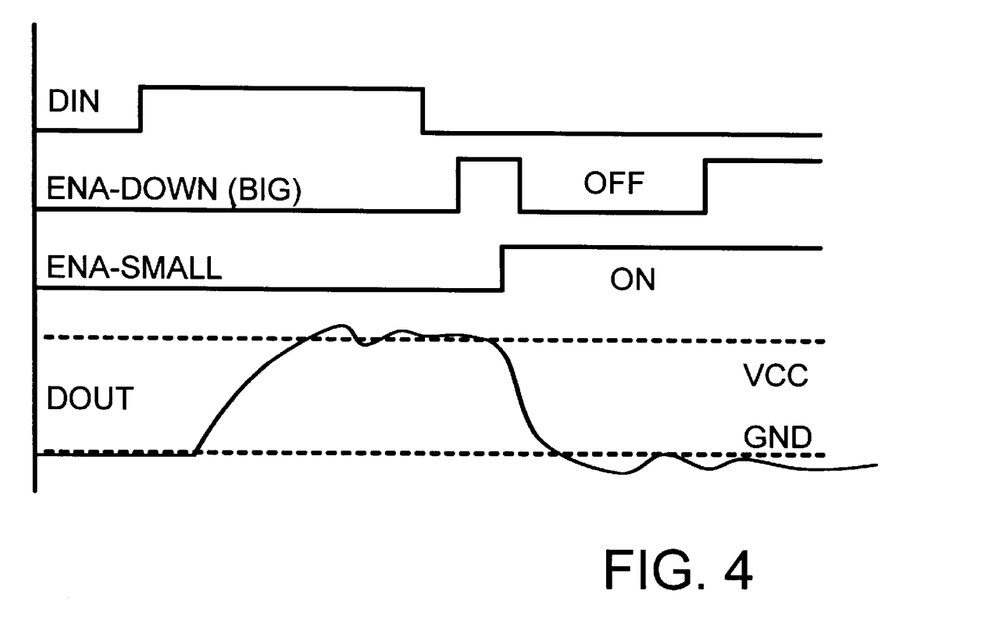
FIG. 4 is a waveform diagram of an output buffer that disables the larger driver transistors during the end of the voltage transition and when ringing occurs.

Timing for Pulse-Disabled Large Drivers—FIG. 4

FIG. 4 is a waveform diagram of an output buffer that disables the large driver transistors during the end of the voltage transition and when ringing occurs. The large driver transistors in a second stage are normally on (rather than normally off) but are pulsed off at the critical time when reflections are received. Thus the output buffer is in a higher impedance state during the ringing period by pulsing off the low-impedance second-stage drivers. The high-impedance stage acts as a termination resistor, helping to dampen ringing.

The large pull-down driver is disabled by a low-going pulse of ENA-DOWN. Rather than sense the output voltage crossing Vcc/2, as in the parent application, the pulse is internally generated from the input to the output buffer, DIN. The starting time and length of the pulse is set by logic delays in a pulse generator. The length of the pulse is designed to be long enough to keep the large driver transistor off for the second half of the voltage transition, and the period of time when the larger reflections are received.

The exact length of the period is not critical, but about 5–10 nano-seconds is typical for current IC technology. Since static current is measured over a long period of time, perhaps several milli-seconds, the pulse can last 5 to 15 nano-seconds, but less than the minimum cycle period of the output signal.

The smaller pull-down transistor is enabled by ENA-SMALL. The smaller pull-down transistor is turned on by DIN changing, and at about the same time that the larger pull-down transistor is disabled. The smaller pull-down transistor remains on the entire time and is not pulsed off.

Depending on the relative delays in the circuit, ENA-DOWN may first switch on and then pulse off as shown in FIG. 4. This is beneficial, as the larger driver is initially on as the output-voltage transition begins, but is then disabled for the second half of the voltage transition and remains disabled during the ringing period. Thus the larger transistor helps to rapidly swing the output voltage, but shuts off before ringing begins.

Schematic of Pulse-Disabled Output Buffer

Figure 5:
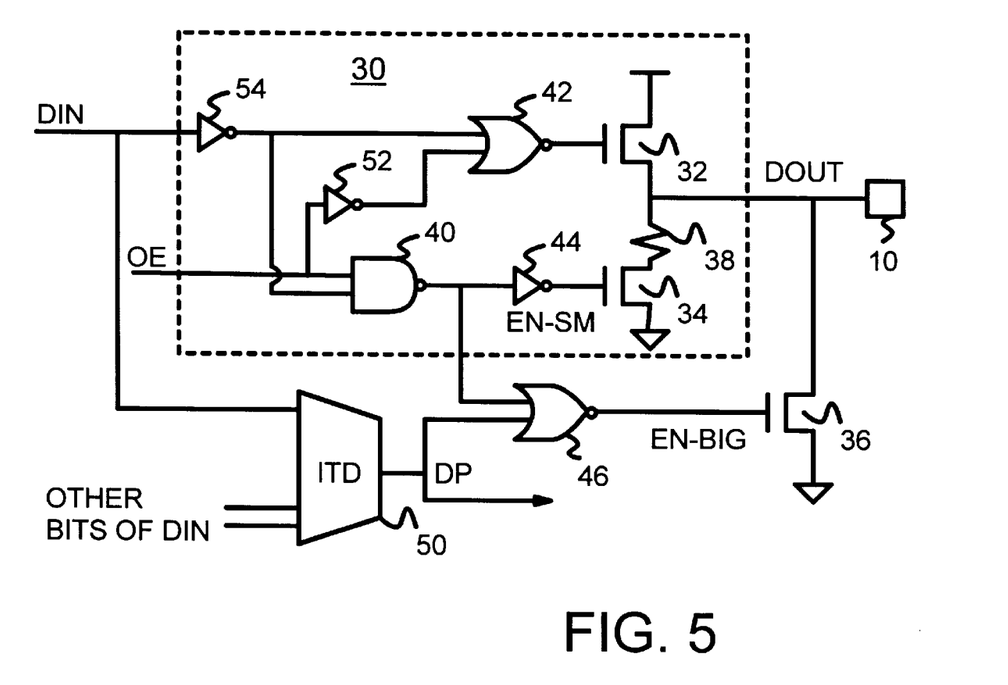
FIG. 5 is a schematic diagram of an output buffer that disables the larger driver transistor using a pulse generator.

FIG. 5 is a schematic diagram of an output buffer that disables the larger driver transistor using a pulse generator. The circuit diagrammed in FIG. 5 generates the waveform of FIG. 4.

An internal input signal DIN is buffered by inverter 54, which drives NOR gate 42 and NAND gate 40. An output enable OE signal is also input to NAND gate 40. Inverter 52 inverts OE for input to NOR gate 42. When OE is low, output buffer 30 is disabled and does not drive output pin 10.

NOR gate 42 drives n-channel pull-up transistor 32, which drives DOUT output pin 10 high when DIN is high and OE is high. Only one pull-up is provided because power-supply ringing is not as problematic as is ground bounce. However, two pull-down drivers are used: large driver transistor 36 and small driver transistor 34.

Output pin 10 is driven by the drain of large driver transistor 36 and by the drain of smaller driver transistor 34 through resistor 38. During and immediately after the later part of the voltage transition, when ringing occurs, large driver transistor 36 is disabled so that only small driver transistor 34 is enabled. Only small driver transistor 34 continues to drive the output low until ground is reached. Resistor 38 increases the output impedance, helping to absorb reflections.

Small driver transistor 34 thus acts as a dynamic driver transistor, being used during voltage slewing, while larger driver transistor 36 is used as a static driver to supply a large D.C. current sink after the output voltage has completed its swing.

The output from NAND gate 40 is inverted by inverter 44 and drives the gate of small driver transistor 34. The output of NAND gate 40 is also input to NOR gate 46, which drives the gate of large driver transistor 36.

Large driver transistor 36 is pulsed off by a pulse generated by input-transition detector 50. When input DIN changes from high to low, detector 50 generates a pulse DP. This pulse DP is a high-going pulse. The high-going DP pulse is input to NOR gate 46 and temporarily disabled large driver transistor 36.

Other neighboring output buffers (not shown) similar to output buffer 30 also receive the DP pulse from detector 50. These other output buffers also have large driver transistors that are pulsed off when DIN changes. The DIN inputs to these other output buffers are also received by detector 50. Any low-going transition of any DIN for any neighboring pin generates the DP pulse and disables large driver transistors for all neighboring outputs.

Resistor 38 is in series with the output and thus serves to increase the output impedance. The higher output impedance helps dampen reflected waves and reduce ringing. Resistor 38 is sized to provide a matching impedance to the characteristic impedance of the wiring trace attached to output pin 10. The impedance of resistor 38 is about 25 ohms.

Dynamic Impedance Switching

The impedance of the output buffer is dynamically changed or tuned as the output voltage changes. Initially, both the large and small driver transistors 34, 36 are driving, and the large size of the large driver transistor 36 provides a low impedance and high current drive to rapidly switch the voltage to about the TTL-logic switching threshold, 1.5 volts. Then the larger driver transistor 36 is pulsed off, and the impedance increases to the larger impedance of the small driver transistor 34 and resistor 38. Thus higher impedance is provided near the end of the output voltage transition, before ringing occurs. The resistor in the higher impedance stage absorbs the reflected waves, reducing ringing. Finally the DP pulse ends and large driver transistor 36 is again enabled, lowering the impedance. Thus the output buffer's impedance is switched by the pulse.

Large driver transistor 36 is connected to a noisy ground, while small driver transistor 34 is connected to a quiet ground. Internal signals and components such as inverters 44, 52, 54, and NOR gates 42, 46 and NAND gate 40 are connected to separate, quiet supplies to minimize the effects of ground bounce. The gates of the driver transistors are driven from the quiet supplies, minimizing bounce-induced ringing.

Both stages drive the output during the initial part of the voltage transition. Both stages contribute to driving the output during the speed-critical first portion of the output swing. The higher impedance of the small driver transistor is seen at the end of the voltage transition when ringing occurs. The small driver transistor 34 and resistor 38 act as active termination of the PCB wiring trace connected to output pin 10.

Figure 6:
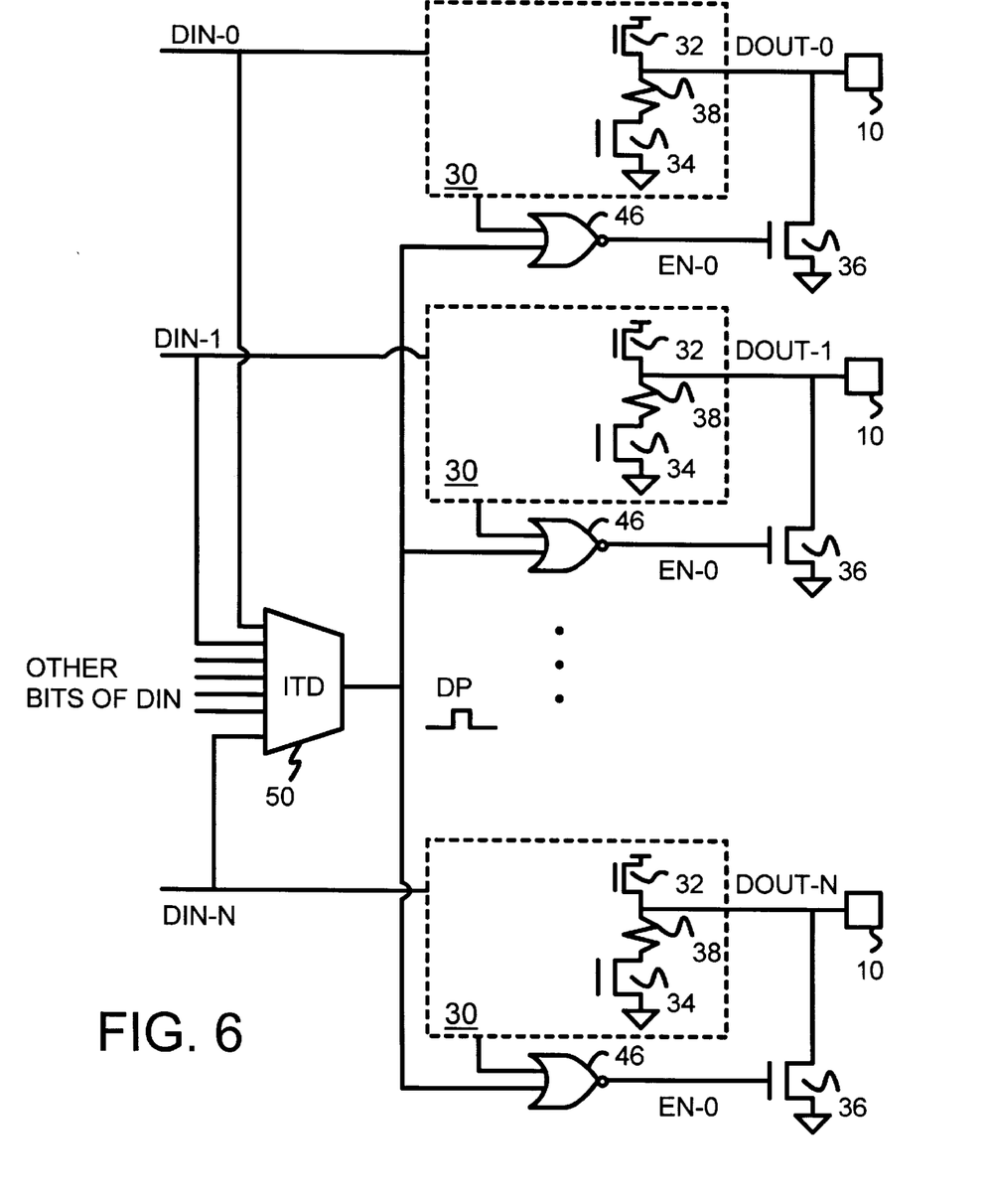
FIG. 6 illustrates a group of neighboring output buffers that generate disabling pulses for all outputs when any output is driven low.

Neighbor Sensing—FIG. 6

FIG. 6 illustrates a group of neighboring output buffers that generate disabling pulses for all outputs when any output is driven low. Most CMOS chips have many outputs. Often these outputs are located near one another, such as for different bits driving a multi-bit data or address bus.

Each output pin is driven by its own output buffer 30, which includes pull-up transistor 32, resistor 38, and small driver transistor 34 as shown in detail in FIG. 5. Other components of FIG. 5 are deleted for clarity. Large driver transistors 36 and NOR gates 46 driving the gates of transistors 36 are shown separately from output buffers 30 to highlight their function.

Neighboring output buffers that are switching can draw a great amount of current through the noisy power and ground supplies, causing power and ground bounce. This bounce can be coupled to a static output, causing unwanted fluctuations of the output voltage. The circuit of FIG. 6 detects when neighboring output buffers are switching and temporarily disables the large driver transistors of the output buffer. Although bounce in the noisy power and ground supplies can be coupled to output pin 10 through small driver transistors 34, the amount of coupling is smaller since these transistors are smaller than large driver transistors 36. Resistors 38 also significantly dampen any bounce on the supplies before reaching output pin 10.

Input-transition detector 50 receives inputs from each DIN input to each output buffer 30. When any of the inputs DIN-1, DIN-2, DIN-3 . . . DIN-N, for N neighboring outputs transitions from high to low, detector 50 generates a high-going DP pulse.

The high-going DP pulse generated from detector 50 is sent to all neighboring output buffers 30. NOR gates 46 then disable large driver transistors 36, preventing noise from coupling into output pin 10 from the noisy power and ground supplies.

Neighbor sensing allows any output that is switching and injecting noise into the power or ground supplies to disable other output buffers for a short time. The same pulse generator, detector 50, is used to generate a pulse for isolating its own drivers and the neighbor's drivers. All pin's drivers are disabled at about the same time as the switching pin's driver is disabled, since the same pulse DP is used. Thus the neighbor's drivers are isolated when the ringing occurs.

Figure 7:
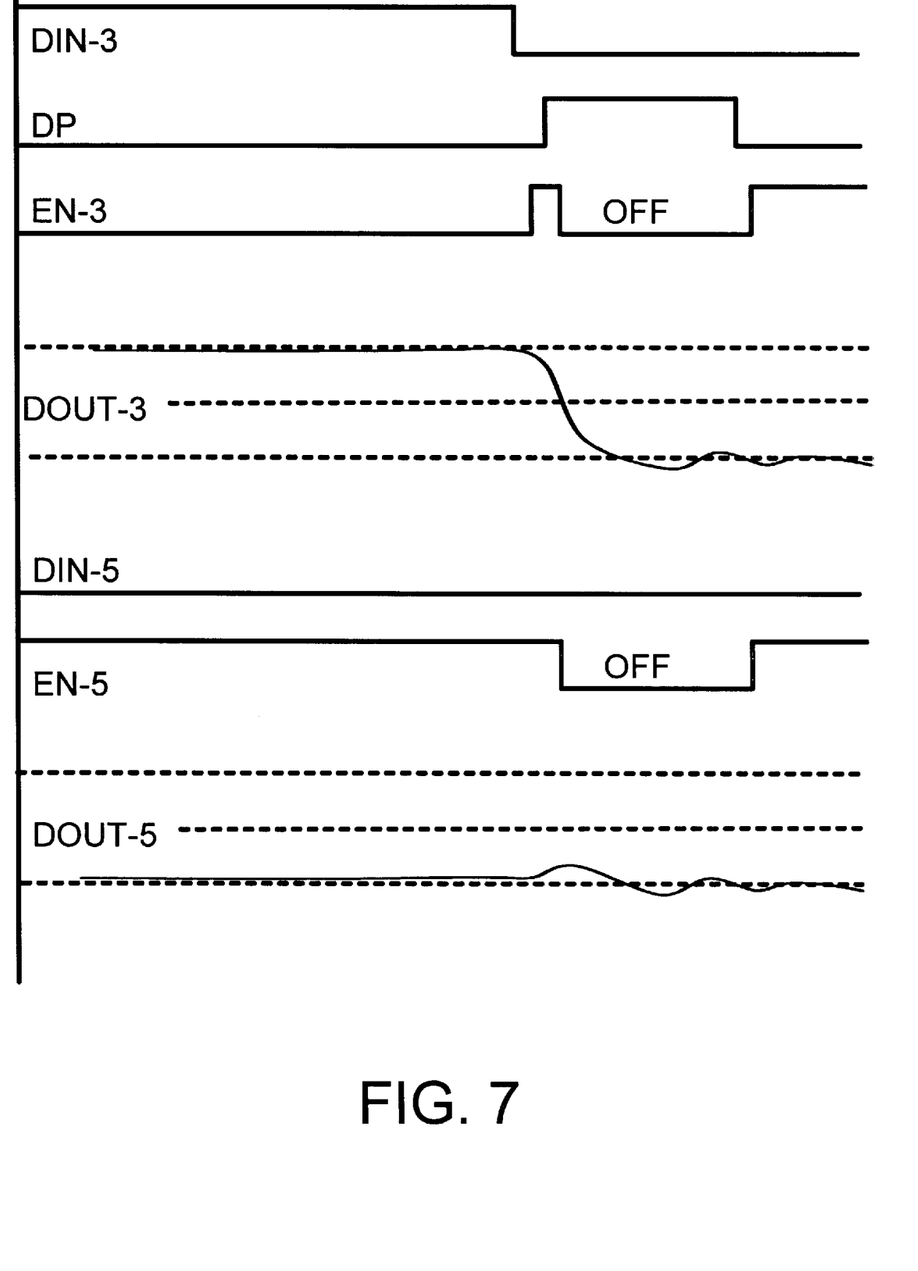
FIG. 7 is a waveform diagram illustrating how an output transition on one pin disables drivers for other pins that are not changing to prevent noise coupling between pins.

Timing of Disabling Neighbor's Drivers—FIG. 7

FIG. 7 is a waveform diagram illustrating how an output transition on one pin disables drivers for other pins that are not changing to prevent noise coupling between pins. When bit 3 of a data bus is to change from high to low, the DIN input to the bit-3 output buffer, DIN-3, is driven low. Detector 50 of FIGS. 5, 6, 8 detects the low-going change on DIN-3 and generates a DP pulse. The bit-3 output buffer drives a high voltage onto the gate of the pull-down small driver transistor, causing the output, DOUT-3, to begin to drop in voltage.

The gate of the large driver transistor is also driven high initially, since the DP pulse takes longer to generate than the delay from DIN-3 to the gate of the large driver transistor. However, when the DP pulse is generated, the gate of the large driver transistor is driven low, disabling the large driver transistor. Thus the DP pulse disables the large driver transistor after the output DOUT-3 begins to slew, but before the output reaches ground and before the first reflection is returned.

The DP pulse is sufficiently wide so that the large driver transistor remains off until most of the ringing has ceased. Then the large driver is re-enabled to supply a large D.C. current sink.

The DP pulse generated by the DIN-3 input is also sent to all other pins in the neighbor group. As an example, bit 5 is also shown in FIG. 7. DIN-5 remains in a constant low state during this time, and the output DOUT-5 likewise remains at ground. However, some ground-bounce noise from the slewing output DOUT-3 is generated and coupled into DOUT-5. This noise coupled in appears as a slight waving of the voltage of DOUT-5 above and below absolute ground.

The DP pulse generated by DIN-3 switching is also sent to the output buffer driving DOUT-5. The large driver transistor for DOUT-5 is also disabled by the DP pulse, even though DOUT-5 is not switching. Disabling other, non-switching, outputs prevents more noise coupling from occurring.

Figure 8:
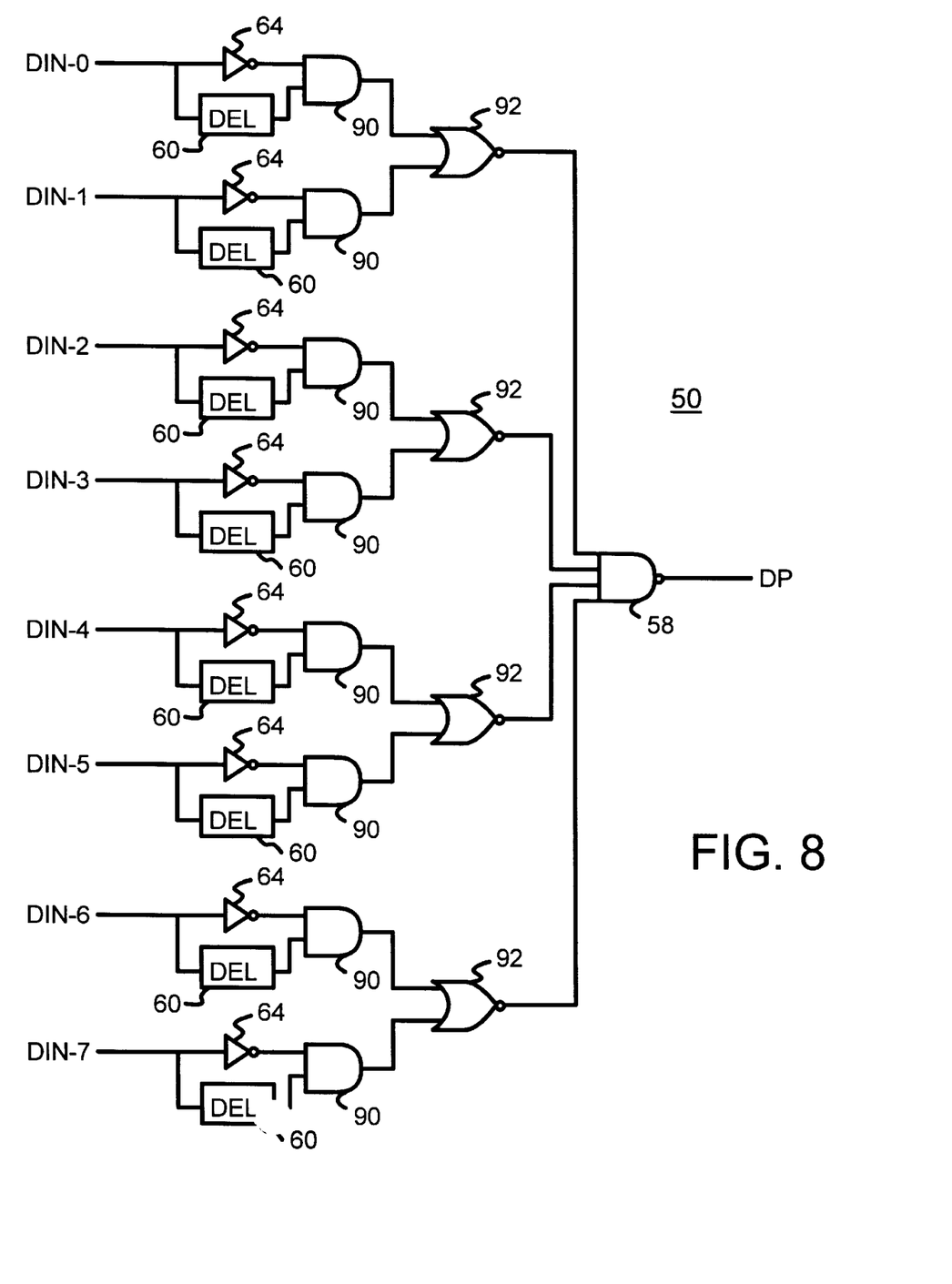
FIG. 8 is a schematic diagram of an input-transition detector for generating a disabling pulse to all adjacent outputs when one output switches.

Transition Detector—FIG. 8

FIG. 8 is a schematic diagram of an input-transition detector for generating a disabling pulse to all adjacent outputs when one output switches. Detector 50 generates the high-going DP pulse used to disable the large driver transistors 36 of FIGS. 5, 6 during and immediately after an output transition.

When input DIN-0 is low, inverter 64 drives a high to one input of AND gate 90, while non-inverting delay 60 drives a low to the other input of AND gate 90. AND gate 90 thus outputs a low to NOR gate 92. When input DIN-0 is high, inverter 64 drives a low to one input of AND gate 90, while non-inverting delay 60 drives a high to the other input of AND gate 90. AND gate 90 thus outputs a low to NOR gate 92. Thus when input DIN-0 is either high or low, a low is output to NOR gate 92. When none of the inputs DIN-0, DIN-1 . . . DIN-7 are changing, all inputs to NOR gates 92 are low. Thus all NOR gates 92 output high voltages to the inputs of NAND gate 58. NAND gate 58 therefore outputs a low for signal DP when none of the inputs is switching.

When any DIN input changes from high to low, its inverter 64 immediately outputs a high to AND gate 90. Since DIN was previously high, a high continues to be output from non-inverting delay 60 for a short period of time. Thus both inputs to AND gate 90 are temporarily high for the changing DIN. AND gate 90 outputs a high to NOR gate 92, which outputs a low to NAND gate 58. A temporary high is then output from NAND gate 58.

Once the change in DIN propagates through non-inverting delay 60, then the lower input to AND gate 90 becomes low, and the high output from AND gate 90 goes low. Once the low is propagated through NOR gate 92 and NAND gate 58, then the DP pulse ends.

The width of the DP pulse is determined by the amount of delay through non-inverting delay 60, less the delay through inverter 64. This DP pulse width can be changed by increasing or decreasing the propagation delay through delay 60.

Figure 9:
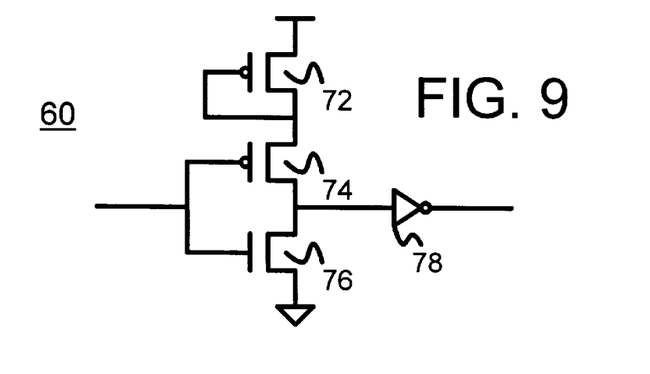
FIG. 9 is a schematic of a non-inverting delay.

FIG. 9 is a schematic of non-inverting delay 60. P-channel transistor 72 has its gate connected to its drain to act as a saturated current source. P-channel transistor 72 can be made with a long gate to limit current and increase delay. The input to delay 60 (the DIN signals from FIG. 8) is applied to the gates of p-channel transistor 74 and n-channel transistor 76. The drains of transistors 74, 76 drive the input of inverter 78. Inverter 78 generates the output of non-inverting delay 60. Additional pairs of inverters can be added to increase delay and thus the pulse width.

Large Driver Initially On Because Pulse-Generation Delay Longer

A logic hazard caused by two signals generated from DIN meeting at NOR gate 46 of FIG. 5 is used to advantage to improve switching speed. DIN propagates to NOR gate 46 more rapidly through output buffer 30 than it does through detector 50. The delay to generate the DP pulse is the delay through inverter 64, AND gate 90, NOR gate 92, and NAND gate 58 of FIG. 8. This is a delay of one inverter and three gates, including one 4-input NAND gate that is slower than the 2-input gates.

The delay through output buffer 30 includes just inverter 54 and NAND gate 40 of FIG. 5. The DP-pulse generation delay is thus one NOR-gate and one NAND-gate delay longer. Thus large driver transistor 36 is enabled for about two gate delays before the DP pulse arrives and disables the large driver transistor. The two-gate delay is less than the fall time of the DOUT output, but sufficiently large to help begin drive the output.

ADVANTAGES OF THE INVENTION

The impedance of a complementary metal-oxide-semiconductor (CMOS) output buffer is dynamically adjusted. Both large and small pull-down transistors drive the output during the initial part of the voltage transition. Both stages contribute to driving the output during the speed-critical first portion of the output swing. The higher impedance of the small driver transistor is seen at the end of the voltage transition when ringing occurs. The small driver transistor and resistor act as active termination of the PCB wiring trace connected to the output pin.

The large, high-drive transistors is disabled only during the end of the voltage transition and while reflected waves are returning to the output buffer. Once ringing has diminished, the large transistors can be re-enabled.

Leaving these large transistors on provides high static output current, such as IOL and IOH. Large IOH and IOL (high D.C. current) allow a low-impedance termination resistor to be used at the far end of the transmission line. The low-impedance termination helps to reduce reflected wavefronts and thus reduces ringing.

A disabling pulse is generated when any output in a group of neighboring output pins is changed. The disabling pulse increases all output buffers' impedances by disabling the larger driver transistors. Static current is still provided by the large driver transistors once the pulse ends, since the pulse only disables the large driver for a short time. A shorter overall delay can be achieved since the preceding stage drives a smaller output-stage transistor for the high-impedance stage. Input-transition-detection logic does not interfere with the buffer's critical delay.

An output buffer has high current drive and high speed. Noise is reduced from the fast edge rate, including ringing, undershoot, overshoot, and ground bounce. The impedance of the output buffer is dynamically controlled to provide low impedance as the output voltage is rapidly changing, but high impedance when the reflected wave front is received to dampen the reflections. The larger drivers are left on during static periods to provide strong $I_{OH}$ and $I_{OL}$ output currents but these drivers turn off during the critical ringing period. Outputs of neighboring pins are disabled when one output buffer switches to prevent noise coupling into other pin's outputs.

ALTERNATE EMBODIMENTS

Several other embodiments are contemplated by the inventors. For example, the timing of the disabling pulse can be adjusted. For very low noise and light loading applications, the larger driver can be disabled for the full duration of the output transition.

The embodiments described herein use separate pull-down transistors, but only one pull-up transistor, since power-supply bounce is less of a problem in today's circuits. However, separate larger and smaller pull-up transistors can also be used. Separate pulse generators can be used for disabling the large pull-up and pull-down driver transistors to compensate for larger ground ringing or bounce.

Control inputs can be added to modify the outputs buffers described herein for three-state or high-Z operation. When the entire buffer is disabled, both pull-up and pull-down transistors are disabled. Changing inverters to a NAND gate driving the pull-ups and a NOR gate driving the pull-downs with additional disable circuitry for the second stage can accomplish this in a well-known manner.

The resistors in series with the smaller driver transistors can be implemented as diffusion resistors or as polysilicon resistors. Other technologies could also be used. The neighboring pins could be only the two immediately adjacent pins, or all pins sharing the same metal bus for power or ground, such as all pins on one side of a chip or between two ground pins.

Current may flow in either direction, as negative current can flow from ground to the power supply. Thus the pull-up can drive a positive current to the output while the pull-down can drive a negative current to the output. A single series resistor to the output can be used rather than two separate resistors as described.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

APPENDIX—DEVICE SIZES

The following are the W/L transistor sizes in microns for FIGS. 5, 8, 9. L is 0.6 micron unless otherwise indicated.

Gate 90, 92 is implemented as a complex AND-OR-Invert gate.

| Reference # | W | L |
|---|---|---|
| 32 | 595 | 0.65 |
| 34 | 290 | 0.65 |
| 36 | 560 | 0.65 |
| 64(PMOS) | 12 | 1.0 |
| 64(NMOS) | 4 | 1.0 |

| Reference # | W(PMOS) | W(NMOS) |
|---|---|---|
| 40 | 13 | 39 |
| 42 | 39 | 39 |
| 44 | 39 | 39 |
| 52 | 26 | 13 |
| 54 | 26 | 26 |
| 46 | 13 | 39 |
| 90 | 13 | 39 |
| 92 | 13 | 39 |
| 72 | 15 | |
| 74 | 15 | |
| 76 | | 4 |
| 78 | 13 | 13 |

We claim:

1. An impedance-switching output buffer comprising:

an input;

a low-impedance stage for driving current to an output;

a higher-impedance stage for driving current to the output;

a pulse generator, coupled to the input, for generating a pulse when the input switches to indicate that the output is to switch from a high voltage to a ground voltage;

disable means, receiving the pulse from the pulse generator, for disabling the low-impedance stage in response to the beginning of the pulse and re-enabling the low-impedance stage in response to the end of the pulse;

wherein both the low-impedance stage and the higher-impedance stage are enabled to drive current to the output after the end of the pulse, whereby static current is provided by both the low-impedance stage and the higher-impedance stage.

2. The impedance-switching output buffer of claim 1 wherein the low-impedance stage comprises:

a pull-down MOS transistor connected to conduct current between a ground supply and the output;

and wherein the higher-impedance stage comprises:

a resistor connected between the output and a first node;

a pull-up MOS transistor connected to conduct current between a power supply and the output; and a pull-down MOS transistor connected to conduct current between the ground supply and the first node;

whereby the resistor increases impedance of the output buffer and absorbs reflections when the low-impedance stage is disabled by the pulse.

3. The impedance-switching output buffer of claim 2 wherein the disable means comprises:

logic gate means, receiving the pulse, for driving a low voltage as a disabling voltage onto a control gate of the pull-down MOS transistor in the low-impedance stage in response to the pulse;

wherein the disabling voltage prevents current from flowing through the low-impedance stage to the output, whereby the low-impedance stage is disabled by the pulse.

4. The impedance-switching output buffer of claim 3 further comprising:

neighbor logic means, in the pulse generator, for receiving neighbor inputs from neighboring output buffers, the neighbor logic means generating the pulse when one of the neighbor inputs switches, indicating that a neighboring output switch to the ground voltage;

neighbor isolation means, coupled to receive the pulse from the pulse generator, for driving the disabling voltage onto control gates of low-impedance stages in the neighboring output buffers, the disabling voltage preventing current from flowing through the low-impedance stages to the output, whereby the low-impedance stage is disabled by the neighbor inputs when a neighboring output buffer switches.

5. The impedance-switching output buffer of claim 4 wherein the end of the pulse occurs less than 10 nanoseconds after the beginning of the pulse, whereby the pulse is sufficiently long to disable the low-impedance stage during ringing after the output reaches the power-supply voltage or the ground voltage.

6. The impedance-switching output buffer of claim 4 wherein the disable means comprises a NOR gate.

7. A reduced-noise output buffer comprising:

an output pin coupled to an external pin of an integrated circuit (IC) package, the external pin for connecting to a wiring trace generating a reflection back to the external pin;

an input for indicating when the reduced-noise output buffer is to drive the output pin low to a ground voltage;

a pull-up driver transistor for driving a first current to the output pin from a first power supply, the pull-up driver transistor having a first control gate;

a pull-down driver transistor for driving a second large current to the output pin from a first ground supply, the pull-down driver transistor having a second control gate;

a pull-down impedance transistor for driving a third small current to the output pin from the first ground supply, the pull-down impedance transistor having a third control gate;

wherein the second large current is larger than the third small current, the pull-down impedance transistor presenting a higher impedance to the output pin than the pull-down driver transistor;

pull-down pulse means, responsive to the input, for generating a pull-down isolation pulse in response to the input;

pull-down isolation means, for disabling the pull-down driver transistor when the pull-down isolation pulse is generated by the pull-down pulse means, whereby higher impedance to the output pin is provided by the pull-down impedance transistor when the pull-down driver transistor is disabled by the pull-down isolation pulse, the higher impedance for absorbing and reducing noise.

8. The reduced-noise output buffer of claim 7 wherein:

the pull-down pulse means comprises a first pulse generator receiving the input, for generating the pull-down isolation pulse when the input changes state to indicate that the output pin be driven to the ground voltage, the pull-down isolation pulse temporarily disabling the pull-down driver transistor as the output pin is driven below the first power supply, the pull-down isolation pulse sufficiently long in duration to disable the pull-down driver transistor while the reflection from the wiring trace is returned to the external pin;

whereby the pull-down driver transistor is disabled while the reflection is returned.

9. The reduced-noise output buffer of claim 8 wherein:

the pull-down driver transistor is initially enabled as the reduced-noise output buffer begins to pull the output pin down from the first power supply, but the pull-down isolation pulse disabling the pull-down driver transistor before the output pin reaches the ground voltage, whereby the pull-down driver transistor is initially on but pulsed off before the output pin reaches the ground voltage.

10. The reduced-noise output buffer of claim 9 wherein:

the pull-down impedance transistor comprises a MOS transistor and a resistor in series, the resistor for increasing the impedance presented to the output pin;

whereby impedance is increased by the resistor.

11. The reduced-noise output buffer of claim 10 further comprising:

neighbor pulse generator means, receiving other inputs to other output buffers driving external pins of the IC package, the neighbor pulse generator means generating the pull-down isolation pulse for disabling the pull-down driver transistor in response to the other inputs when the external pins are being switched by one of the other output buffers, whereby noise is reduced by disabling the driver transistors when other the output buffers switch.

12. The reduced-noise output buffer of claim 11 wherein:

the neighbor pulse generator means comprises a plurality of pulse generators, each receiving one of the other inputs to the other output buffers, each for generating a pulse when an input changes.

13. The reduced-noise output buffer of claim 12 further comprising:

neighbor isolation means in each of the other output buffers, receiving the pull-down isolation pulse from the neighbor pulse generator means or from the pull-down pulse means, for disabling pull-down driver transistors in each of the other output buffers when the pull-down isolation pulse is received, whereby the pull-down driver transistors of the other output buffers are also disabled.

14. The reduced-noise output buffer of claim 13 wherein the neighbor isolation means is coupled to a quiet ground supply coupled to a separate pin of the IC package than the first ground supply, whereby separate supplies are used for isolation circuitry.

15. A CMOS output buffer for driving an external wiring trace comprising:

an output for driving current to the external wiring trace;

an input;

a static pull-down driver transistor having a control gate for controlling current from a noisy ground supply to the output;

a dynamic stage responsive to the input having:

a pull-up transistor having a gate responsive to the input for controlling current from a power supply to the output;

a dynamic pull-down transistor having a gate responsive to the input for controlling current from the noisy ground supply to the output, the dynamic pull-down transistor having a higher impedance than the static pull-down driver transistor;

a disabling gate receiving the input and receiving a disabling pulse, for driving a disabling voltage onto the control gate of the static pull-down driver transistor when the disabling pulse is applied; and a pulse generator for generating the disabling pulse to the disabling gate when the input is switching to a lower voltage, the disabling pulse for temporarily disabling the static pull-down driver transistor as the output is slewing to a lower voltage, whereby the static pull-down driver transistor is disabled by the disabling pulse.

16. The CMOS output buffer of claim 15 wherein:

the disabling pulse is sufficiently long in duration to disable the static pull-down driver transistor until most reflections from the external wiring trace have passed.

17. The CMOS output buffer of claim 15 wherein:

the dynamic pull-down transistor and the static pull-down driver transistor are each n-channel MOS transistors with sources connected to the noisy ground supply.

18. The CMOS output buffer of claim 16 wherein:

the pulse generator further receives inputs from other output buffers on a same die, the pulse generator also for generating the disabling pulse when another output buffer switches another output to the power supply;

the disabling pulse sent to the other output buffers for disabling all static pull-down driver transistors in the other output buffers when any input changes, whereby the static pull-down driver transistors in the other output buffer are disabled when any input is switched.

19. The CMOS output buffer of claim 16 wherein:

the pull-up transistor has a drain connected to the output;

the static pull-down driver transistor has a drain connected to the output;

the dynamic pull-down transistor has a drain connected to the output through a resistor, whereby the dynamic stage has resistors which increase impedance.

* * * * *